United States Patent [19]
Ono

[11] Patent Number: 5,847,609
[45] Date of Patent: Dec. 8, 1998

[54] AUTOMATIC GAIN CONTROL CIRCUIT FOR SELECTIVELY PROVIDING AN ACCURATE LINEARITY OR A BROAD BANDWIDTH

[75] Inventor: Akihiko Ono, Kasugai, Japan

[73] Assignee: Fujitsu Limited, Kanagawa, Japan

[21] Appl. No.: 734,811

[22] Filed: Oct. 22, 1996

[30] Foreign Application Priority Data

Mar. 19, 1996 [JP] Japan ................................ 8-063394

[51] Int. Cl.$^6$ ............................................. H03G 3/30
[52] U.S. Cl. .................................... 330/279; 330/281
[58] Field of Search ............................... 330/252, 254, 330/279, 281; 360/67, 68

[56] References Cited

U.S. PATENT DOCUMENTS 5,432,474  7/1995  Lauffenburger et al. ............... 330/252

*Primary Examiner*—Steven Mottola
*Attorney, Agent, or Firm*—Nikaido Marmelstein Murray & Oram LLP

[57] ABSTRACT

An AGC circuit varies a bandwidth of an input unit and accuracy of linearity of the AGC output. A first input unit converts a first input current into a first voltage. A second input unit, identical to the first input unit, converts a second input current into a second voltage. A variable constant current source generates first and second constant currents. The first constant current flows from the first input unit to the variable constant current source. The second constant current flows from the second input unit to the variable constant current source. The first and second constant currents are varied by a control signal supplied by an external signal source so that the bandwidths of the first and second input units are varied. The AGC output of the AGC circuit is calculated based on the first voltage and the second voltage.

14 Claims, 10 Drawing Sheets

AUTOMATIC GAIN CONTROL CIRCUIT FOR SELECTIVELY PROVIDING AN ACCURATE LINEARITY OR A BROAD BANDWIDTH

BACKGROUND OF THE INVENTION

The present invention relates to an automatic gain control (AGC) circuit and, more particularly to an AGC circuit of a current input type which is suitable for a servo signal reading circuit for reading a servo signal output from a photodiode provided in a head amplifier of a magneto-optical disk apparatus.

DESCRIPTION OF THE RELATED ART

FIG. 1 is a circuit diagram of a conventional AGC circuit connected with signal sources. In FIGS. 1, 1A and 1B indicate the signal sources. The signal source 1A comprises an input current generating unit 2A and a capacitor 3A. The input current generating unit 2A generates an input current IsA which is input to an input unit 5A of the AGC circuit 4. Similarly, the signal source 1B comprises an input current generating unit 2B and a capacitor 3B. The input current generating unit 2B generates an input current IsB which is input to an input unit 5B of the AGC circuit 4.

The AGC circuit 4 comprises the input units 5A and 5B and an AGC calculating unit 11. The input unit 5A converts the input current IsA into a voltage by logarithmic compression. The input unit 5B converts the input current IsB into a voltage by logarithmic compression.

The input unit 5A includes a current input terminal 6A, a constant current source 7A, a diode 8A, an NPN transistor 9A and a diode 10A. The input current IsA is input to the current input terminal 6A. The diode 8A and the NPN transistor 9A together form a current mirror circuit. The diode 10A is provided for generating an output voltage VsA when a current controlled by the input current IsA is input to the NPN transistor 9A.

The input unit 5B includes a current input terminal 6B, a constant current source 7B, a diode 8B, an NPN transistor 9B and a diode 10B. The input current IsB is input to the current input terminal 6B. The diode 8B and the NPN transistor 9B together form a current mirror circuit. The diode 10B is provided for generating an output voltage VsB when a current controlled by the input current IsB is input to the NPN transistor 9B.

The AGC calculating unit 11 comprises a differential amplifier which calculates and outputs an AGC output based on the input voltages VsA and VsB input from the input units 5A and 5B. The AGC unit 11 includes NPN transistors 12A and 12B, resistors 13a and 13B and a constant current source 14. The resistors 13A and 13B serve as load elements with respect to the respective NPN transistors 12A and 12B. The constant current source generates a constant current $I_0$, Currents $I_0A$ and $I_0B$ flow in the respective resistors 13A and 13B.

In the above-mentioned AGC circuit 4, a difference between the current $I_0A$ and $I_0B(I_0A-I_0B)$ is represented by $\{(IsA-IsB)/(IsA+IsB)\} \times I_0$. The current difference $(I_0A-I_0B)$ is converted into a voltage and the voltage is output as the AGC output.

The constant currents IsA and IsB increase the impedance of the respective input units 5A and 5B so as to prevent the frequency band from being narrowed due to the respective capacitors 3A and 3B. However, an accuracy of the current flowing in the current mirror circuit formed by the diode 8A and the NPN transistor 9A and the current flowing in the current mirror circuit formed by the diode 8B and the NPN transistor 9B is decreased as the currents IbA and IbB are increased and the frequency bands of the input units 5A and 5B are expanded. In this case, there is a problem in that the accuracy of linearity of the AGC output is decreased.

The cut-off frequency fc of the input unit 5A is represented by $1/(2\pi \cdot Re \cdot Ci)$, where Re is a turn-on resistance of the NPN transistor 9A and Ci is a capacitance of the capacitor 3A. Since the turn-on resistance Re is represented as $Re=Vt/(IsA+IbA)$ where Vt is a thermal voltage of about 26 mV at room temperature, the cut-off frequency fc is increased and the bandwidth is broadened by increasing the constant current IbA.

On the other hand, a current error $dI_0$, which is generated in the current mirror circuit formed by the diode 8A and the NPN transistor 9A, is represented as $dI_0=\{exp(dVbe/Vt)-1\}(IsA+IbA)$ where dVbe is an off-set voltage of the base-emitter voltage of the NPN transistor 9A. Thus, the current error $dI_0$ is increased as the constant current IbA is increased. The current error causes the accuracy of linearity of the AGC output to be deteriorated.

A servo signal reading circuit, which reads a servo signal output from a photodiode of a head amplifier of a magneto-optical disk apparatus, does not require a broad bandwidth but require highly accurate linearity for the AGC output. On the other hand, when the disk apparatus is in the envelope servo state which is achieved immediately after a track search is started or immediately before the track search is ended, highly accurate linearity is not required but a broad bandwidth is required. Additionally, when the disk apparatus is in the high speed search state which is achieved between immediately after the start of the search and immediately before the end of the search, merely a bandwidth sufficient for tracing the servo signal frequency is required but the high accuracy of linearity is not required.

Accordingly, there is a problem in that either the frequency characteristic or the linearity of the AGC output must be sacrificed when the AGC circuit shown in FIG. 1 is used for the above-mentioned servo signal reading circuit.

SUMMARY OF THE INVENTION

It is a general object of the present invention to provide an improved and useful AGC circuit in which the above-mentioned problem is eliminated.

A more specific object of the present invention is to provide an AGC circuit which varies a bandwidth of an input unit and accuracy of linearity of the AGC output.

Another object of the present invention is to provide an AGC circuit which increases the accuracy of linearity by sacrificing the bandwidth and broadens the bandwidth by sacrificing the accuracy of linearity of the AGC output.

In order to achieve the above-mentioned objects, there is provided according to one aspect of the present invention an automatic gain control circuit which is selectively set to a state where an output from the automatic gain control circuit has an accurate linearity or a state where the automatic control unit has a broad with respect to inputs thereto, the automatic gain control circuit comprising:

a first input unit converting a first input current into a first voltage, a bandwidth of the first input unit being variable;

a second input unit, identical to the first input unit, converting a second input current into a second voltage, a bandwidth of the second input unit being variable;

a main variable constant current source generating a first constant current and a second constant current, the first constant current flowing from the first input unit to the main variable constant current source, the second constant current flowing from the second input unit to the main variable constant current source, the first and second constant currents being varied by a control signal supplied by an external signal source so that the bandwidth of the first and second input units are varied; and an automatic gain control output calculating unit calculating the output based on the first voltage and the second voltage.

According to the above-mentioned invention, the bandwidth of the first and second input units are varied by changing the first and second constant currents generated by the main variable constant current source. The first and second constant currents are varied by the control signal. When the bandwidth of the first and second input units are broadened, the accuracy of linearity of the output from the automatic gain control output calculating unit is decreased. On the other hand, when the bandwidths of the first and second input units are narrowed, the accuracy of linearity of the output is increased.

In one embodiment according to the present invention, the first input unit may include a first variable constant current source which generates a first constant base current and a first constant conversion current in response to the first constant current flowing to the main variable constant current source, the first constant conversion current being converted into the first voltage based on the first input current and the first constant base current; and the second input unit may include a second variable constant current source which generates a second constant base current and a second constant conversion current in response to the second constant current flowing to the main variable constant current source, the second constant conversion current being converted into the second voltage based on the second input current and the second constant base current.

In the automatic gain control circuit according to the present invention, the control signal may be selectively set to one of a high level and a low level; and the first and second constant currents may be set to a lower value when the control signal is set to the high level so that the output from the automatic gain control output calculating unit has an accurate linearity.

Additionally, the control signal may be selectively set to one of a high level and a low level; and the first and second constant currents may be set to a higher value when the control signal is set to the low level so that the first and second input units have a broad bandwidth.

In one embodiment according to the present invention, the first input unit may include a first transistor and a first load element, the first input current and the first constant base current being supplied to a base of the first transistor, the first constant conversion current being supplied to a collector of the first transistor, one terminal of the first load element being connected to a voltage source and an opposite terminal of the first load element being connected to the collector of the first transistor so that the first voltage is obtained at the opposite terminal of the first load element; and the second input unit may include a second transistor and a second load element, the second input current and the second constant base current being supplied to a base of the second transistor, the second constant conversion current being supplied to a collector of the second transistor, one terminal of the second load element being connected to the voltage source and an opposite terminal of the second load element being connected to the collector of the second transistor so that the second voltage is obtained at the opposite terminal of the second load element.

The automatic gain control circuit according to the present invention may further comprise:

a first peak hold circuit, provided between the first input unit and the automatic gain control output calculating unit, having a first time constant with respect to a holding operation of a peak value of the first voltage, the first time constant being decreased when the bandwidth of the first input unit is narrowed, the first time constant being increased when the bandwidth of the first input unit is broadened; and a second peak hold circuit, identical to the first peak hold circuit and provided between the second input unit and the automatic gain control output calculating unit, having a second time constant with respect to a holding operation of a peak value of the second voltage, the second time constant being decreased when the bandwidth of the second input unit is narrowed, the second time constant being increased when the bandwidth of the second input unit is broadened.

According to this invention, the first and second time constants of the first and second peak hold circuits are decreased when a high accuracy of linearity of the output is required so that the first and second voltages output from the first and second input units are not influenced by the first and second time constants. On the other hand, when broad bandwidths are required for the first and second input units, the first and second time constants of the first and second input units are increased so that a high-frequency noise is eliminated.

The first and second time constants may be controlled based on the control signal.

Additionally, there is provided according another aspect of the present invention an automatic gain control circuit which is selectively set to a state where an output from the automatic gain control circuit has an accurate linearity or a state where the automatic control unit has a broad bandwidth with respect to inputs thereto, the automatic gain control circuit comprising:

a first input unit converting a first input current into a first voltage, a bandwidth of the first input unit being variable;

a second input unit converting a second input current into a second voltage, a bandwidth of the second input unit being variable;

a third input unit converting a third input current into a third voltage, a bandwidth of the third input unit being variable;

a fourth input unit converting a fourth input current into a fourth voltage, a frequency band of the second input unit being variable;

a main variable constant current source generating first, second, third and fourth constant currents, the first constant current flowing from the first input unit to the main variable constant current source, the second constant current flowing from the second input unit to the main variable constant current source, the third constant current flowing from the third input unit to the main variable constant current source, the fourth constant current flowing from the fourth input unit to the main variable constant current source, the first, second, third and fourth constant currents being varied by a control signal supplied by an external signal source so that the bandwidths of the first, second, third and fourth input units are varied;

a first automatic gain control output calculating unit calculating a first output based on the first voltage and the fourth voltage; and a second automatic gain control output calculating unit calculating a second output based on the second voltage and the third voltage.

In one embodiment of the above-mentioned invention, the first input unit may include a first variable constant current source which generates a first constant base current, a first constant conversion current and a first additional constant conversion current in response to the first constant current flowing to the main variable constant current source;

the second input unit may include a second variable constant current source which generates a second constant base current, a second constant conversion current and a second additional constant conversion current in response to the second constant current flowing to the main variable constant current source;

the third input unit may include a third variable constant current source which generates a third constant base current, a third constant conversion current and a third additional constant conversion current in response to the third constant current flowing to the main variable constant current source; and the fourth input unit may include a fourth variable constant current source which generates a fourth constant base current, a fourth constant conversion current and a fourth additional constant conversion current in response to the fourth constant current flowing to the main variable constant current source;

wherein the first and second constant conversion currents are converted into the first voltage;

the third and fourth constant conversion currents are converted into the fourth voltage;

the first and third additional constant conversion currents are converted into the third voltage; and the second and fourth constant conversion currents are converted into the second voltage.

The control signal may be selectively set to one of a high level and a low level; and the first, second, third and fourth constant currents may be set to a lower value when the control signal is set to the high level so that the first and second outputs from the first and second automatic gain control output calculating units have an accurate linearity.

Additionally, the control signal may be selectively set to one of a high level and a low level; and the first, second, third and fourth constant currents may be set to a higher value when the control signal is set to the low level so the first, second, third and fourth input units have broad bandwidths.

In one embodiment of the present invention the first input unit may include a first transistor, a first additional transistor and a first load element, the first input current and the first constant base current being supplied to a base of each of the first transistor and the first additional transistor, the first constant conversion current being supplied to a collector of the first transistor, the first additional constant conversion current being supplied to a collector of the first additional transistor, one terminal of the first load element being connected to a voltage source and an opposite terminal of the first load element being connected to the collector of the first transistor so that the first voltage is obtained at the opposite terminal of the first load element;

the second input unit may include a second transistor, a second additional transistor and a second load element, the second input current and the second constant base current being supplied to a base of each of the second transistor and the second additional transistor, the second constant conversion current being supplied to a collector of the second transistor, the second additional constant conversion current being supplied to a collector of the second additional transistor, one terminal of the second load element being connected to the voltage source and an opposite terminal of the second load element being connected to the collector of the second additional transistor so that the second voltage is obtained at the opposite terminal of the second load element;

the third input unit may include a third transistor, a third additional transistor and a third load element, the third input current and the third constant base current being supplied to a base of each of the third transistor and the third additional transistor, the third constant conversion current being supplied to a collector of the third transistor, the third additional constant conversion current being supplied to a collector of the third additional transistor, one terminal of the third load element being connected to the voltage source and an opposite terminal of the third load element being connected to the collector of the third additional transistor so that the third voltage is obtained at the opposite terminal of the third load element; and the fourth input unit may include a fourth transistor, a fourth additional transistor and a fourth load element, the fourth input current and the fourth constant base current being supplied to a base of each of the fourth transistor and the fourth additional transistor, the fourth constant conversion current being supplied to a collector of the fourth transistor, the fourth additional constant conversion current being supplied to a collector of the fourth additional transistor, one terminal of the fourth load element being connected to the voltage source and an opposite terminal of the fourth load element being connected to the collector of the fourth transistor so that the fourth voltage is obtained at the opposite terminal of the fourth load element.

The automatic gain control circuit according to the present invention may further comprise:

a first peak hold circuit, provided between the first input unit and the first automatic gain control output calculating unit, having a first time constant with respect to a holding operation of a peak value of the first voltage, the first time constant being decreased when the bandwidth of the first input unit is narrowed, the first time constant being increased when the bandwidth of the first input unit is broadened;

a second peak hold circuit, identical to the first peak hold circuit and provided between the second input unit and the second automatic gain control output calculating unit, having a second time constant with respect to a holding operation of a peak value of the second voltage, the second time constant being decreased when the bandwidth of the second input unit is narrowed, the second time constant being increased when the bandwidth of the second input unit is broadened;

a third peak hold circuit, identical to the first peak hold circuit and provided between the third input unit and the second automatic gain control output calculating unit, having a third time constant with respect to a holding operation of a peak value of the third voltage, the third time constant being decreased when the bandwidth of the second input unit is narrowed, the third time constant being increased when the bandwidth of the third input unit is broadened; and a fourth peak hold circuit, identical to the first peak hold circuit and provided between the fourth input unit and the first automatic gain control output calculating unit, having a fourth time constant with respect to a holding operation of a peak value of the fourth voltage, the fourth time constant being decreased when the bandwidth of the fourth input unit is narrowed, the fourth time constant being increased when the bandwidth of the fourth input unit is broadened.

The first, second, third and fourth time constants may be controlled based on the control signal.

Other objects, features and advantages of the present invention will become more apparent from the following detailed description when read in conjunction with the accompanying drawings.

DETAILED DESCRIPTION OF THE PREFERRED EMBODIMENTS

Figure 1:
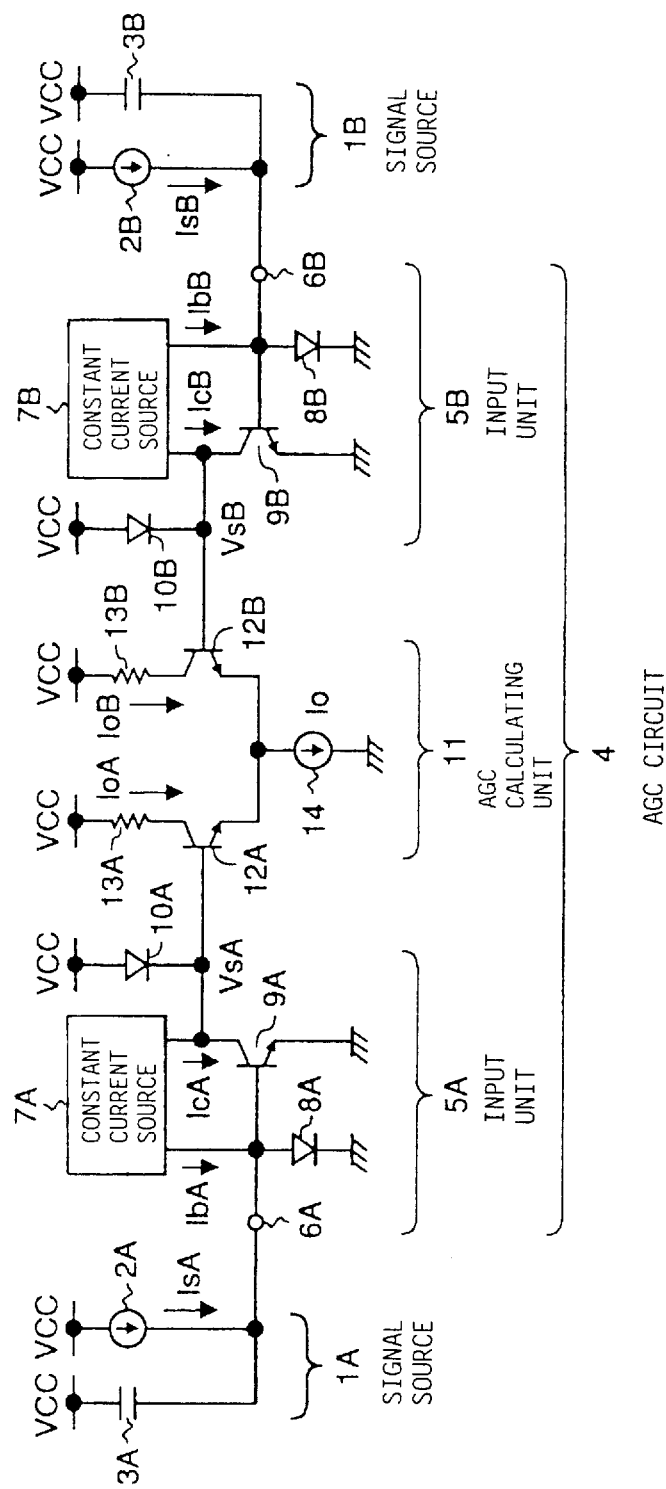
FIG. 1 is a circuit diagram of a conventional AGC circuit.
Figure 2:
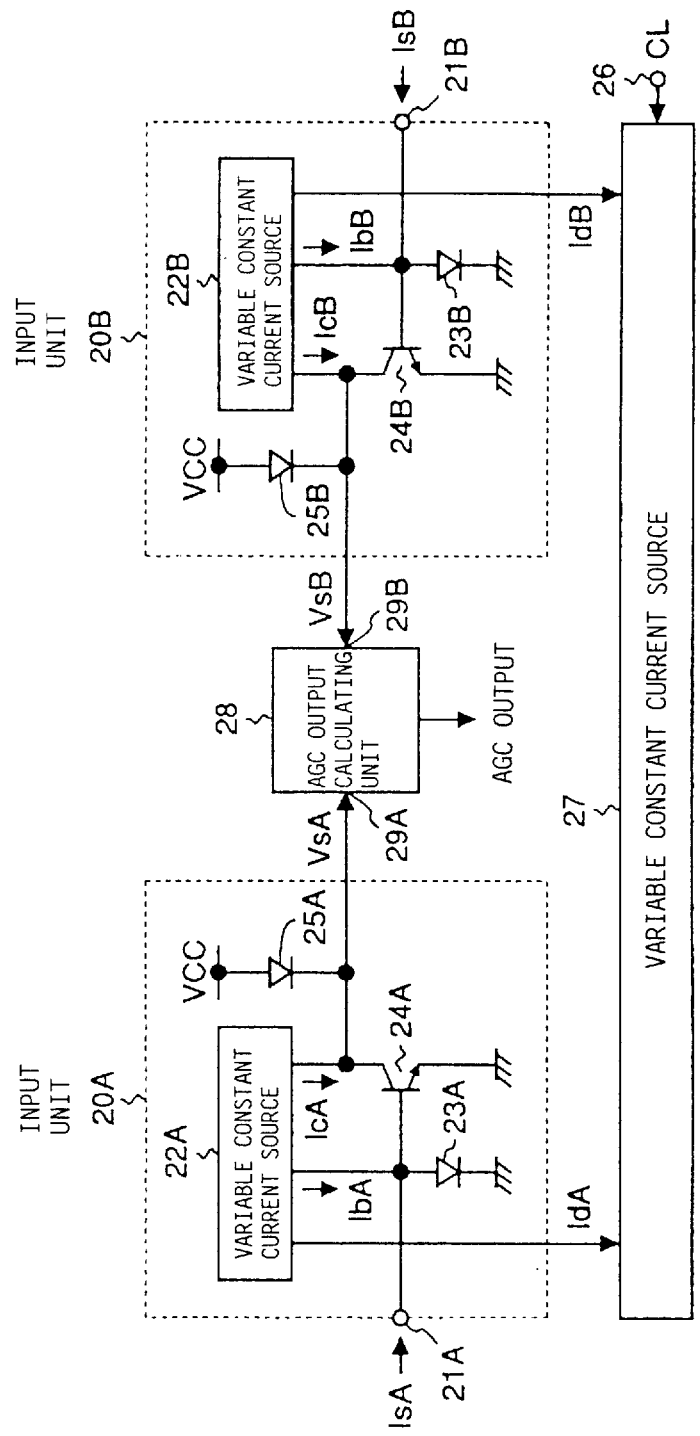
FIG. 2 is a circuit diagram of an AGC circuit according to a first embodiment of the present invention.

A description will now be given, with reference to FIG. 2, of a first embodiment of the present invention. FIG. 2 is a circuit diagram of an AGC circuit according to the first embodiment of the present invention. The AGC circuit shown in FIG. 2 is used for generating an AGC output based on first and second voltages which are generated by respective currents responsive to respective first and second input currents IsA and IsB. The first and second input currents IsA and IsB are input from a photodiode provided in a head amplifier of a magneto-optical disk apparatus.

As shown in FIG. 2, the AGC circuit according to the first embodiment of the present invention comprises input units 20A and 20B, an AGC calculating unit 28 and a variable constant current source 27. The input unit 20A converts the input current IsA into a voltage by logarithmic compression. The input unit 20B converts the input current IsB into a voltage by logarithmic compression.

The input unit 20A includes a current input terminal 21A, a variable constant current source 22A, a diode 23A, an NPN transistor 24A and a diode 25A. The input current IsA is input to the current input terminal 21A. The diode 23A and the NPN transistor 24A together form a current mirror circuit. The diode 25A, which serves as a load element, is provided for generating an output voltage VsA when a current controlled by the input current IsA is input to the NPN transistor 24A.

The input unit 20B includes a current input terminal 21B, a variable constant current source 22B, a diode 23B, an NPN transistor 24B and a diode 25B. The input current IsB is input to the current input terminal 21B. The diode 23B and the NPN transistor 24B together form a current mirror circuit. The diode 25B, which serves a load element, is provided for generating an output voltage VsB when a current controlled by the input current IsB is input to the NPN transistor 24B.

The variable constant current source 27 is controlled by a control signal CL input via a control signal input terminal 26 so as to control constant currents IbA, IcA, IbB and IcB output from the respective variable constant current sources 22A and 22B.

The AGC calculating unit 28 calculates an AGC output based on the output voltages VsA and VsB supplied by the respective input units 20A and 20B. The output voltage VsA is input via an input terminal 29A, and the output voltage 20B is input via an input terminal 29B.

Figure 3:
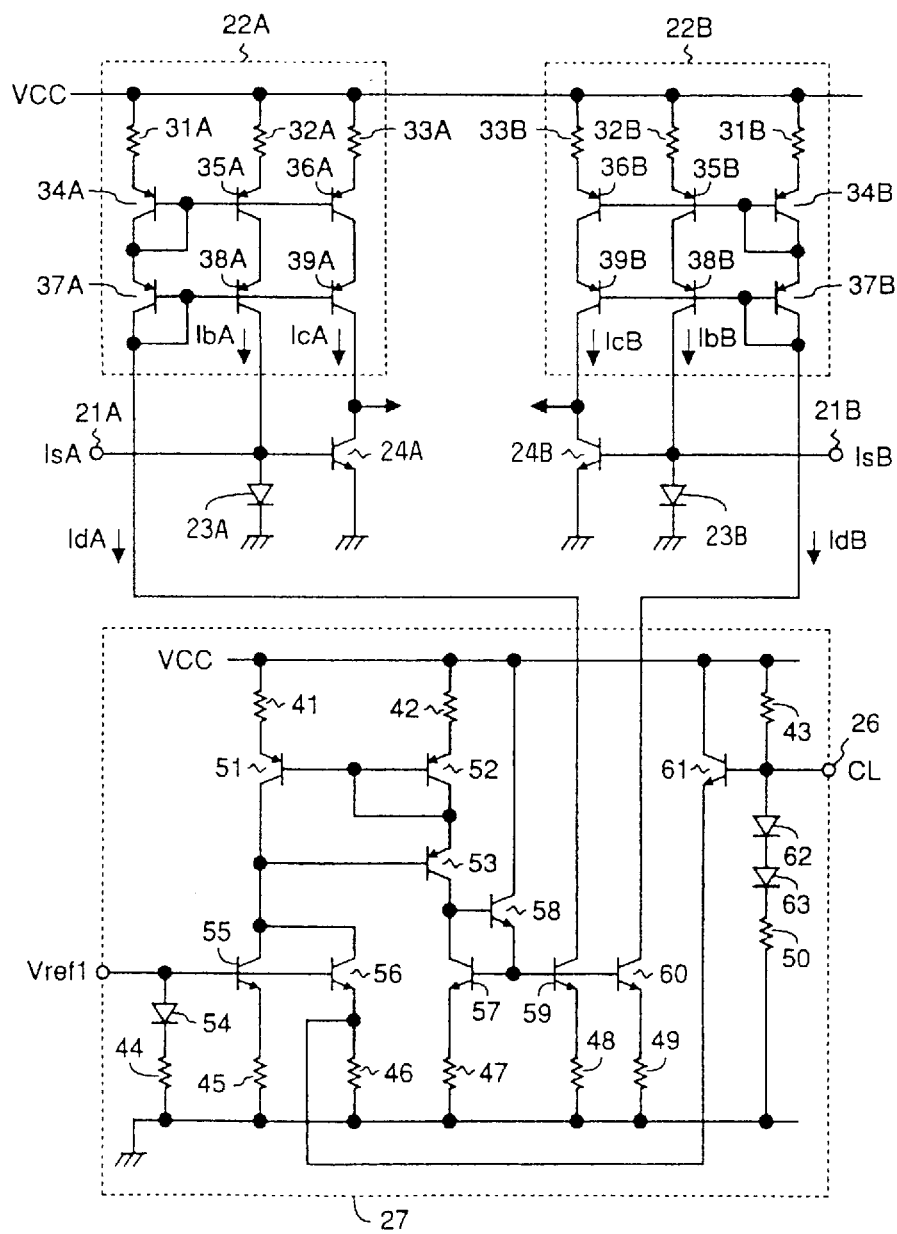
FIG. 3 is a circuit diagram of variable constant current sources shown in FIG. 2.

FIG. 3 is a circuit diagram of the variable constant current sources 22A, 22B and 27.

The variable constant current source 22A comprises resistors 31A, 32A and 33A and PNP transistors 34A, 35A, 36A, 37A, 38A and 39A. The PNP transistors 34A, 35A, 36A, 37A, 38A and 39A are connected to form a current mirror circuit. The collector of the PNP transistor 38A is connected to the base of the NPN transistor 24A so as to supply the constant current IbA. The collector of the PNP transistor 39A is connected to the collector of NPN transistor 24A so as to supply the constant current IcA.

In the variable constant current source 22A, the constant current IbA and the constant current IcA are current mirror outputs with respect to the input current IsA. That is, the transistor 23A and the transistor 24A together form a current mirror circuit so as to generate the current mirror currents IbA and IcA. Thus, the input stage including the variable constant current source 22A can output the output current corresponding to the input current IsA input from the current input terminal 21A.

The variable constant current source 22B comprises resistors 31B, 32B and 33B and PNP transistors 34B, 35B, 36B, 37B, 38B and 39B. The PNP transistors 34B, 35B, 36B, 37B, 38B and 39B are connected to form a current mirror circuit. A collector of the PNP transistor 38B is connected to the base of the NPN transistor 24B so as to supply the constant current IbB. The collector of the PNP transistor 39B is connected to the collector of NPN transistor 24B so as to supply the constant current IcB.

The variable constant current source 27 comprises resistors 41 to 50, PNP transistors 51 to 53, NPN transistors 55–61 and diodes 54, 62 and 63. The diode 54 and the resistor 44 together form a constant current source.

Additionally, the diode 54 and the NPN transistors 55 and 56 together form a current mirror circuit. The PNP transistors 51 to 53 together form a current mirror circuit. The NPN transistors 57–60 together form a current mirror circuit. The resistors 43 and 50 and the diodes 62 and 63 together form a base bias circuit. Additionally, a reference voltage Vref1 is input to the base of the transistor 55.

A value of each of the constant currents IbA and IcA is controlled by a constant current IdA flowing through the PNP transistor 37A. Similarly, a value of each of the constant currents IbB and IcB is controlled by a constant current IdB flowing through the PNP transistor 37B.

The constant currents IdA and IdB flowing through the respective PNP transistors 37A and 37B are controlled by a value of a constant current flowing through the NPN transistor 57. The value of the constant current flowing through the transistor NPN 57 is controlled by a value of a constant current flowing through the PNP transistor 51.

A value of a constant current flowing through the PNP transistor 51 is controlled by a value of constant currents flowing through the NPN transistors 55 and 56. The constant currents flowing through the NPN transistors 55 and 56 are controlled by a value of a constant current flowing through the NPN transistor 54.

When the control signal CL is set to a high level (CL=H), the NPN transistor 61 is turned on. Thus, an emitter voltage of the NPN transistor 56 is equal to the source voltage VCC. Thus, the NPN transistor 56 is set to a cut-off state and no current flows through the NPN transistor 56. Accordingly, the current flowing through the PNP transistor 51 is equal to the current flowing through the NPN transistor 55.

On the other hand, when the control signal is set to a low level (CL=L), the NPN transistor 61 is turned off. Thus, the NPN transistor 56 is turned on and the constant current flowing through the PNP transistor 51 is equal to a sum of the currents flowing through the NPN transistors 55 and 56.

That is, when the control signal CL is set to the high level, the constant currents IbA and IbB are decreased to be less than those obtained when the control signal CL is set to the low level. This causes bandwidths of the input units 20A and 20B to be narrowed, but the accuracy of linearity of the AGC output is increased.

On the other hand, when the control signal is set to the low level, the constant currents IbA and IbB are increased to be greater than those obtained when the control signal CL is set to the high level. This causes the accuracy of linearity of the AGC output to be relatively low, but the bandwidths of the input units 20A and 20B are broadened.

Figure 4:
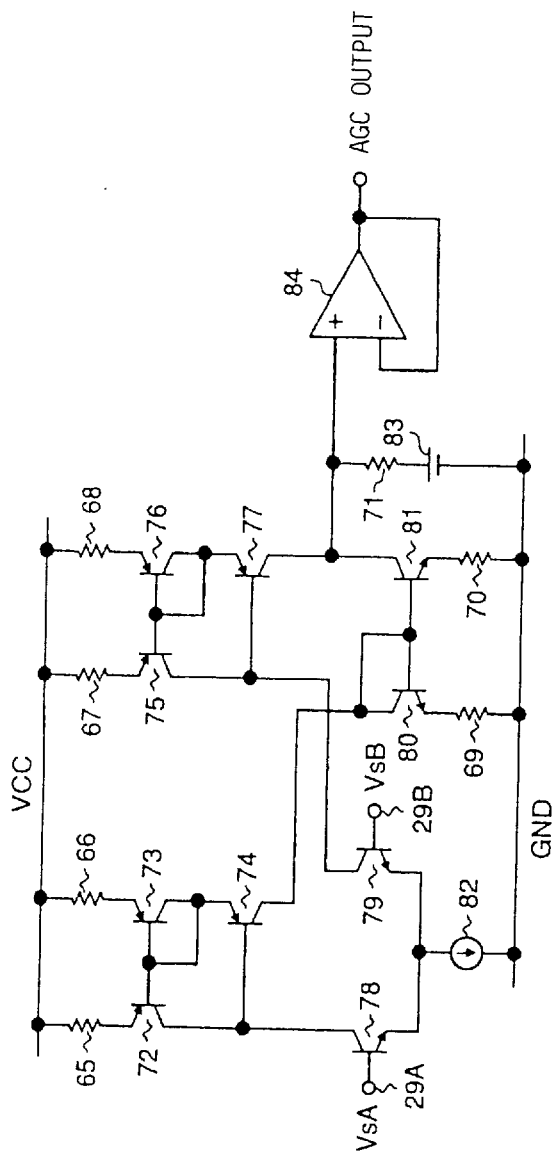
FIG. 4 is a circuit diagram of an AGC calculating unit shown in FIG. 2.

FIG. 4 is a circuit diagram of the AGC calculating unit 28. As shown in FIG. 4, the AGC calculating unit 28 comprises resistors 65 to 71, PNP transistors 72 to 77, NPN transistors 78 to 81, a constant current source 82, a bias voltage source 83 and a differential amplifier 84 which constitutes a voltage follower circuit.

The PNP transistors 72 to 74 together form a current mirror circuit. The PNP transistors 75 to 77 together form another current mirror circuit. Additionally, the NPN transistors 80 and 81 together form another current mirror circuit.

In the AGC calculating unit 28, a current difference between the output current of transistor 78 and the output current of the transistor 79 is calculated for obtaining an AGC output. The current difference between the output current of transistor 78 and the output current of the transistor 79 is converted into a voltage having the center value determined by the bias voltage obtained by the bias voltage source 83 and the resistor 71. The voltage obtained from the current difference is input to the differential amplifier 84.

In the above-mentioned AGC circuit according to the first embodiment of the present invention, the control signal CL is set to the high level when the disk apparatus is in an on-track state in which a signal rendering the frequency to be equal to zero is input and a broad bandwidth is not required but a high accuracy of linearity of the AGC output is required. Thus, the bandwidths of the input units 20A and 20B are narrowed, but the accuracy of linearity is increased.

On the other hand, when the envelope servo is performed during a track search in which a high accuracy of linearity is not required but a broad bandwidth is required, the control signal CL is set to the low level. Thus, the accuracy of linearity of the AGC output is relatively low, but the bandwidth of the input units 20A and 20B are broadened.

Additionally, when a high-speed search is performed in which a bandwidth sufficient for tracing the servo signal frequency is required and a high accuracy of linearity is not required, the control signal CL is set to the high level. Thus, the bandwidths of the input units 20A and 20B are relatively narrowed, while the accuracy of linearity of the AGC output is increased.

As mentioned above, in the first embodiment of the present invention, the bandwidth of the input units is narrowed but the accuracy of linearity of the AGC output is increased when a broad bandwidth is not required but a high accuracy of linearity is required. On the other hand, the bandwidth of the input units is broadened but the accuracy of linearity of the AGC output is decreased when a broad bandwidth is required but a high accuracy of the linearity is not required. Thus, the AGC circuit according to the present embodiment is convenient for use.

Figure 5:
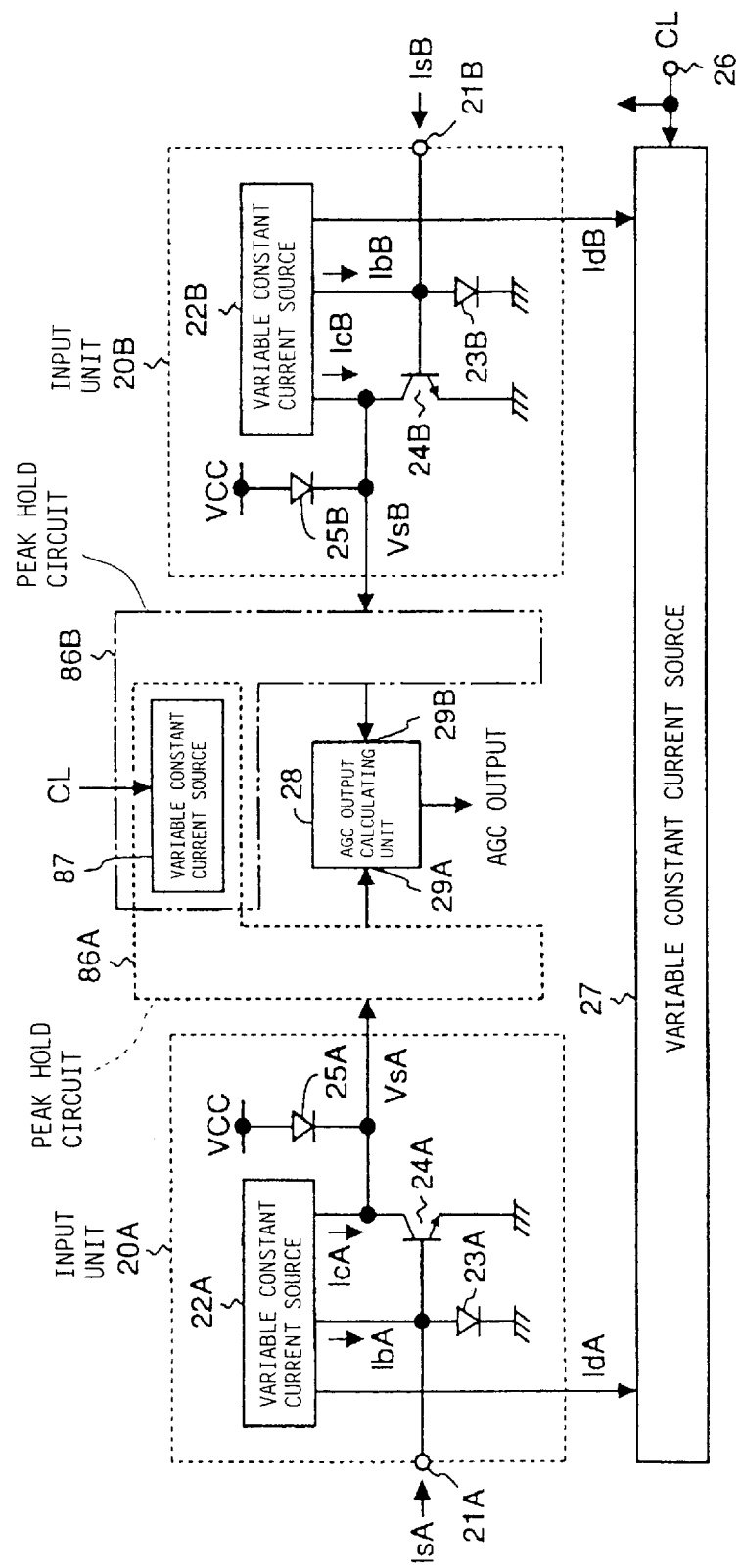
FIG. 5 is a circuit diagram of an AGC circuit according to a second embodiment of the present invention.

A description will now be given, with reference to FIG. 5, of a second embodiment of the present invention. FIG. 5 is a circuit diagram of an AGC circuit according to the second embodiment of the present invention. In FIG. 5, parts that are the same as the parts shown in FIG. 2 are given the same reference numerals, and descriptions thereof will be omitted.

The structure of the AGC circuit shown in FIG. 5 is the same as that of the first embodiment except for a peak hold circuit 86A provided between the input unit 20A and the input terminal 29A of the AGC calculating unit 28 and a peak hold circuit 86B provided between the input unit 20B and the input terminal 29B of the AGC calculating unit 28. A variable constant current source 87 is shared by the peak hold circuits 86A and 86B.

Figure 6:
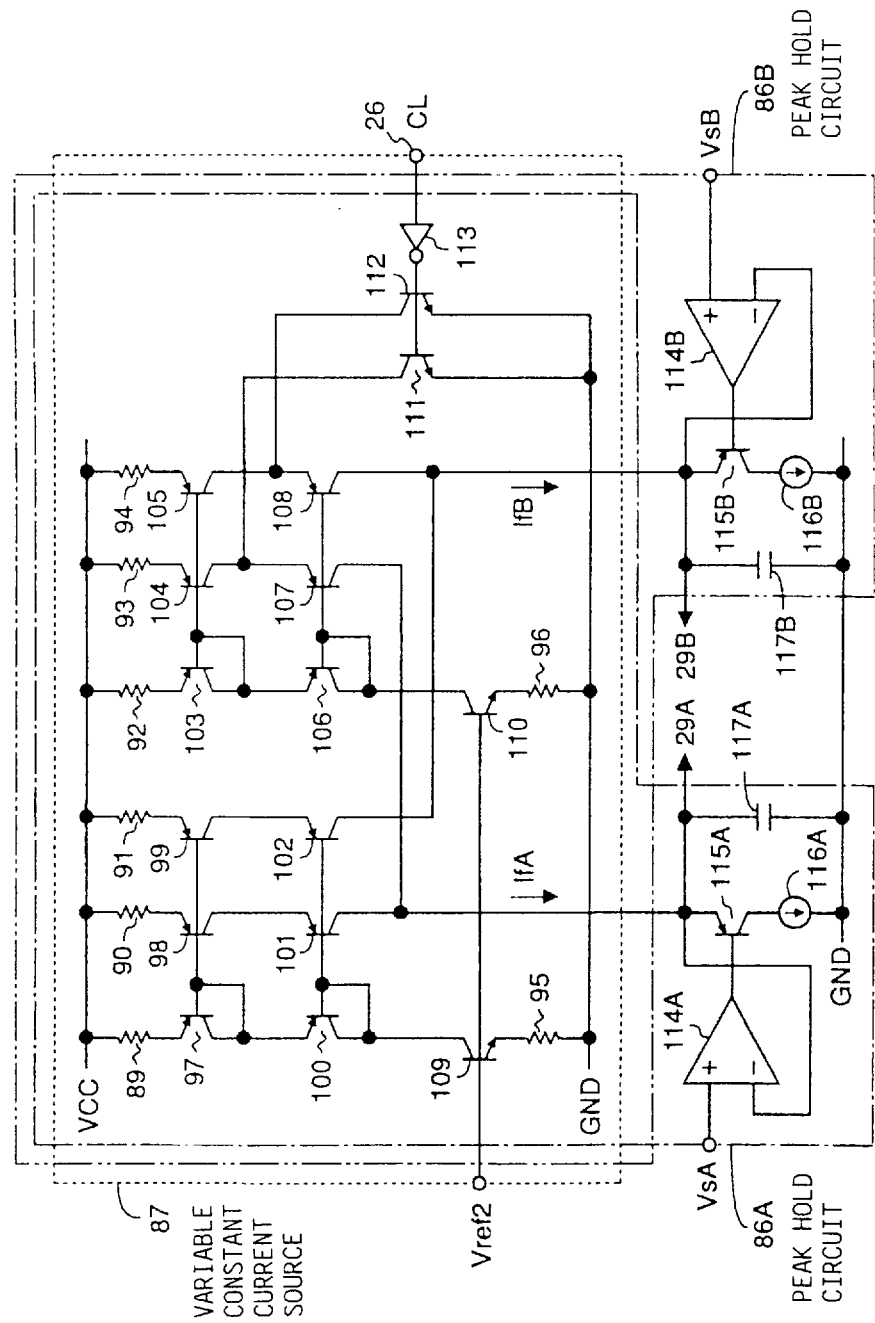
FIG. 6 is a circuit diagram of peak hold circuits shown in FIG. 5.

FIG. 6 is a circuit diagram of the peak hold circuits 86A and 86B. The variable constant current source 87 comprises resistors 89 to 96, PNP transistors 97 to 108, NPN transistors 109 to 112 and an inverter 113. A reference voltage Vref2 is input to a base of the NPN transistor 109.

The PNP transistors 97 to 102 together form a current mirror circuit. The NPN transistor 109 and the resistor 95 together form a constant current source. Additionally, the PNP transistors 103 to 108 together form a current mirror circuit. The NPN transistor 110 and the resistor 96 together form a constant current source.

The peak hold circuit 86A comprises a differential amplifier 114A constituting a voltage follower circuit, a PNP transistor 115A, a constant current source 116A and a capacitor 117A.

The peak hold circuit 86B comprises a differential amplifier 114B constituting a voltage follower circuit, a PNP transistor 115B, a constant current source 116B and a capacitor 117B.

When the control signal CL is set to the high level, the output of the inverter 113 becomes a low level, and thus the NPN transistors 111 and 112 are turned off. As a result, a constant current IfA supplied to the PNP transistor 115A becomes equal to a sum of a constant current flowing through the PNP transistor 101 and a constant current flowing through the PNP transistor 107. A constant current IfB supplied to the PNP transistor 115B becomes equal to a sum of a constant current flowing through the PNP transistor 102 and a constant current flowing through the PNP transistor 108.

On the other hand, when the control signal CL is set to the low level, the output of the inverter 113 becomes a high level, and thus the NPN transistors 111 and 112 are turned on. Thus, the emitter voltage of each of the PNP transistors 107 and 108 becomes equal to the ground voltage. Accordingly, the currents flowing through the transistors 107 and 108 are cut off. As a result, the constant current IfA supplied to the PNP transistor 115A becomes equal to the constant current flowing through the PNP transistor 101. The constant current IfB supplied to the PNP transistor 115B becomes equal to the constant current flowing through the PNP transistor 102.

That is, when the control signal CL is at the high level, the constant currents IfA and IfB flowing through the respective PNP transistors 115A and 115B are increased to be greater than that obtained when the control signal CL is at the low level so that a time constant of each of the peak hold circuits 86A and 86B is decreased. The time constant of each of the peak hold circuits 86A and 86B is determined by a current IfA or IfB input from the variable constant current source 87 and a hold capacitance C of the capacitor 117A or 117B. That is, for example, since the capacitor 117A is charged at a rate represented by V=IfA/C·t, the time constant of each of the peak hold circuit 86A is defined as C/IfA. Accordingly, the time constant is decreased as the current IfA is increased. If the time constant is decreased, the waveform of the voltage at the input terminal 29A follows the waveform of the output voltage VsA input to the differential amplifier 114A.

On the other hand, when the control signal CL is at the low level, the constant currents IfA and IfB flowing through the respective PNP transistors 115A and 115B are decreased to be less than that obtained when the control signal CL is at the high level so that the time constant of each of the peak hold circuits 86A and 86B is increased.

In the above-mentioned second embodiment of the present invention, the control signal CL is set to the high level when the disk apparatus is in an on-track state in which a signal rendering the frequency to be equal to zero is input and a broad is not required but high accuracy of linearity of the AGC output is required. Thus, the bandwidths of the input units 20A and 20B are narrowed, but the accuracy of linearity is increased.

In such a case, the time constants of the peak hold circuits 86A and 86B are decreased so that the output voltages VsA and VsB of the input units 20A and 20B are not influenced by the respective peak hold circuits 86A and 86B.

On the other hand, when the envelope servo is performed during a track search in which a high accuracy of linearity is not required but a broad bandwidth is required, the control signal CL is set to the low level. Thus, the accuracy of linearity of the AGC output is relatively low, but the bandwidths of the input units 20A and 20B are relatively broadened.

In such a case, since the time constants of the peak hold circuits 86A and 86B are increased, a high-frequency noise, for example, due to a prepit (emboss data) can be eliminated, resulting in an accurate counting of track crossings during a track search.

Additionally, when a high speed search is performed in which a bandwidth sufficient for tracing the servo signal frequency is required and a high accuracy of the linearity is not required, the control signal CL is set to the high level. Thus, the bandwidths of the input units 20A and 20B are relatively narrowed, while the accuracy of linearity of the AGC output is increased.

In such a case, the time constants of the peak hold circuits 86A and 86B are decreased so that the output voltages VsA and VsB of the input units 20A and 20B are not influenced by the respective peak hold circuits 86A and 86B. Thus, an accurate counting of the track crossings is performed during a track search.

As mentioned above, in the second embodiment of the present invention, the bandwidth of the input units is narrowed but the accuracy of linearity of the AGC output is increased when a broad bandwidth is not required but a high accuracy of linearity is required. On the other hand, the bandwidth of the input units is broadened but the accuracy of linearity of the AGC output is decreased when a broad bandwidth is required but a high accuracy of linearity is not required. Thus, the AGC circuit according to the present embodiment is convenient for use, and performs an accurate counting of track crossings during a track search.

Figure 7:
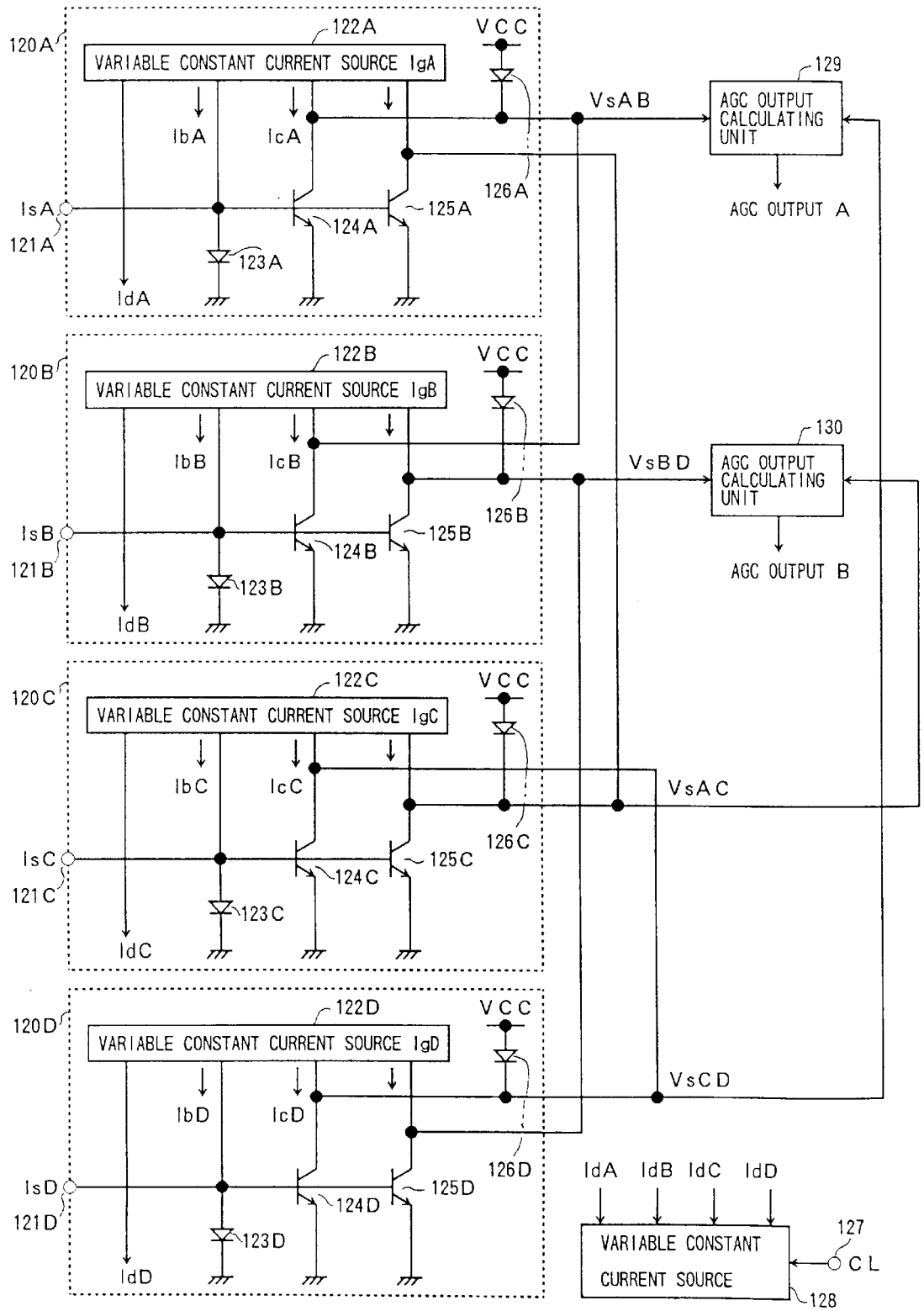
FIG. 7 is a circuit diagram of an AGC circuit according to a third embodiment of the present invention.

A description will now be given, with reference to FIG. 7, of a third embodiment of the present invention. FIG. 7 is a circuit diagram of an AGC circuit according to the third embodiment of the present invention.

The AGC circuit according to the third embodiment generates two AGC outputs based on four inputs. The four inputs may be signals A, B, C and D which are output from a photodiode divided into four parts. For example, a push-pull servo signal is calculated based on the combination of A+B and C+D for controlling a tracking operation. At the same time, a tilt control signal may be calculated based on a combination of A+D and B+C. That is, when different signals must be generated for different controls, outputs based on different combinations are needed which are obtained from the same input signals. In such a case, the AGC circuit such as that shown in FIG. 7 is effective.

The AGC circuit according to the third embodiment is provided with input currents IsC and IsD in addition to the input currents IsA and IsB which are provided in the first and second embodiments so that two AGC outputs A and B are obtained. The AGC output A is obtained based on a first conversion input current and a second conversion input current. The first conversion input current is obtained based on the input currents IsA and IsB supplied by photodiodes of a head amplifier of a magneto-optical disk apparatus. The second conversion input current is obtained based on the inputs currents IsC and IsD which are also supplied by photodiodes provided in the head amplifier of the magneto-optical disk apparatus. On the other hand, the AGC output B is obtained based on a third conversion input current and a fourth conversion input current. The third conversion input current is obtained based on the input currents IsB and IsD. The fourth conversion input current is obtained based on the inputs currents IsA and IsC.

The AGC circuit according to the third embodiment of the present invention comprises, as shown in FIG. 7, input units 120A, 120B, 120C and 120D, AGC calculating units 129 and 130 and a variable constant current source 128. The input current IsA is input to the input unit 120A. The input current IsB is input to the input unit 120B. The input current IsC is input to the input unit 120C. The input current IsD is input to the input unit 120D.

The input unit 120A comprises an input terminal 121A, a variable constant current source 122A and NPN transistors 123A, 124A and 125A. The input current IsA is input to the input terminal 121A from a first signal source (not shown in the figure). The variable constant current source 122A outputs constant currents IbA, IcA and IgA. The NPN transistors 123A, 124A and 125A together form a current mirror circuit.

The input unit 120B comprises an input terminal 121B, a variable constant current source 122B and NPN transistors 123B, 124B and 125B. The input current IsB is input to the input terminal 121B from a second signal source (not shown in the figure). The variable constant current source 122B outputs constant currents IbB, IcB and IgB. The NPN transistors 123B, 124B and 125B together form a current mirror circuit.

The input unit 120C comprises an input terminal 121C, a variable constant current source 122C and NPN transistors 123C, 124C and 125C. The input current IsC is input to the input terminal 121C from a third signal source (not shown in the figure). The variable constant current source 122C outputs constant currents IbC, IcC and IgC. The NPN transistors 123C, 124C and 125C together form a current mirror circuit.

The input unit 120D comprises an input terminal 121D, a variable constant current source 122D and NPN transistors 123D, 124D and 125D. The input current IsD is input to the input terminal 121D from a fourth signal source (not shown in the figure). The variable constant current source 122D outputs constant currents IbD, IcD and IgD. The NPN transistors 123D, 124D and 125D together form a current mirror circuit.

The input unit 120A further comprises a diode 126A which serves as a load element to obtain an output voltage VsAB. The output voltage VsAB is obtained based on the constant currents IcA and IcB which are responsive to the input currents IsA and IsB. That is, the output voltage VsAB is responsive to a sum (IsA+IsB) of the input currents IsA and IsB.

The input unit 120B further comprises a diode 126B which serves as a load element to obtain an output voltage VsBD. The output voltage VsBD is obtained based on the constant currents IgB and IgD which are responsive to the input currents IsB and IsD. That is, the output voltage VsBD is responsive to a sum (IsB+IsD) of the input currents IsB and IsD.

The input unit 120C further comprises a diode 126C which serves as a load element to obtain an output voltage VsAC. The output voltage VsAC is obtained based on the constant currents IgA and IgC which are responsive to the input currents IsA and IsC. That is, the output voltage VsAC is responsive to a sum (IsA+IsC) of the input currents IsA and IsC.

The input unit 120D further comprises a diode 126D which serves as a load element to obtain an output voltage VsCD. The output voltage VsCD is obtained based on the constant currents IcC and IcD which are responsive to the input currents IsC and IsD. That is, the output voltage VsCD is responsive to a sum (IsC+IsD) of the input currents IsC and IsD.

The variable constant current source 128 has an input terminal 127 through which a control signal CL is input. The constant currents IbA, IcA, IgA, IbB, IcB, IgB, IbC, IcC, IgC, IbD, IcD and IgD are controlled by constant currents IdA, IdB, IdC and IdD flowing to the variable constant current source 128.

The AGC calculating unit 129 calculates and outputs the AGC output A based on the output voltages VsAB and VsCD. The AGC calculating unit 130 calculates and outputs the AGC output B based on the output voltages VsBD and VsAC. Each of the AGC calculating units 129 and 130 has a circuit structure the same as that of the AGC calculating unit 28 shown in FIG. 4.

Figure 8:
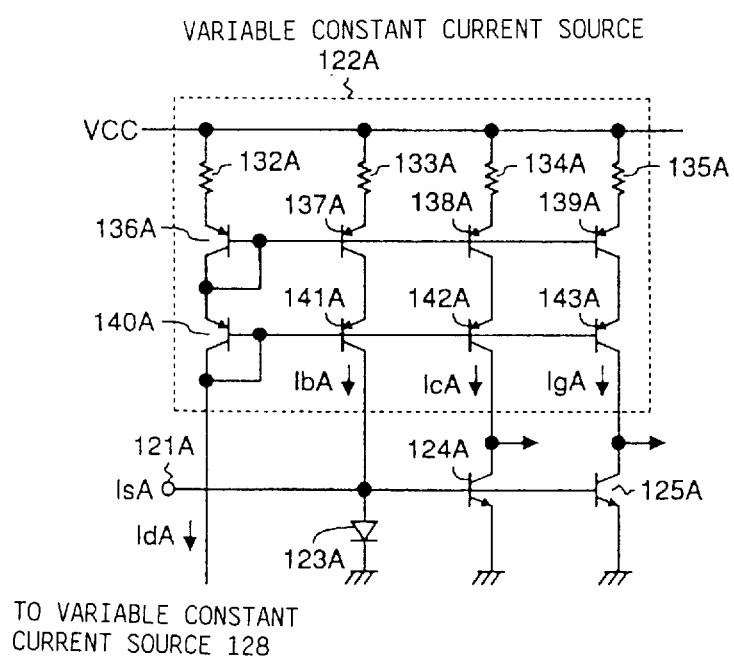
FIG. 8 is a circuit diagram of a variable constant current source shown in FIG. 7.

FIG. 8 is a circuit diagram of the variable constant current source 122A. The variable constant current source 122A comprises resistors 132A, 133A, 134A and 135A and PNP transistors 136A, 137A, 138A, 139A, 140A, 141A, 142A and 143A. The PNP transistors 136A, 137A, 138A, 139A, 140A, 141A, 142A and 143A together form a current mirror circuit. The variable constant current source 122A has almost the same circuit structure as that of the variable constant current source 22A shown in FIG. 3 except for a set of the transistors and a resistor being added so as to generate the constant current IgA. It should be noted that each of other variable constant current sources 122B, 122C and 122D has the same circuit structure as the variable constant current source 122A.

Figure 9:
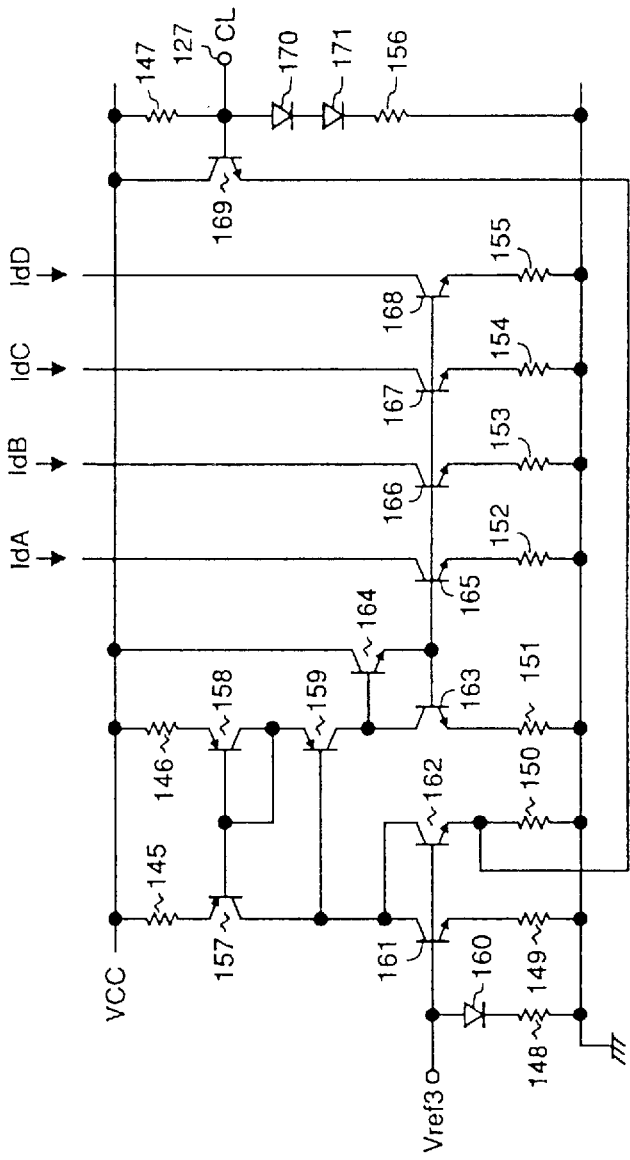
FIG. 9 is a circuit diagram of another variable constant current source shown in FIG. 7.

FIG. 9 is a circuit diagram of the variable constant current source 128. The variable constant current source 128 comprises resistors 145 to 156, PNP transistors 157 to 159 and NPN transistors 160 to 171. A reference voltage Vref3 is input to a base of the NPN transistor 161. The diode 160 and the resistor 148 together form a constant current source.

In the variable constant current source 128, the NPN transistors 160 to 162 together form a current mirror circuit. The NPN transistors 163 to 168 together form another current mirror circuit. The resistors 147 and 156 and the NPN transistors 170 and 171 together form a base bias circuit for the NPN transistor 169.

A value of each of the constant currents IbA, IcA and IgA is controlled by a value of the constant current IdA flowing to the variable constant current source 128. A value of each of the constant currents IbB, IcB and IgB is controlled by a value of the constant current IdB flowing to the variable constant current source 128. A value of each of the constant currents IbC, IcC and IgC is controlled by a value of the constant current IdC flowing to the variable constant current source 128. A value of each of the constant currents IbD, IcD and IgD is controlled by a value of the constant current IdD flowing to the variable constant current source 128.

A value of each of the constant currents IdA, IdB, IdC and IdD is controlled by a value of a constant current flowing through the NPN transistor 163. The value of the constant current flowing through the NPN transistor 163 is controlled by a value of a constant current flowing through the PNP transistor 157. The value of the constant current flowing through the PNP transistor 157 is in turn controlled by values of constant currents flowing through the NPN transistors 161 and 162. The values of constant current flowing through the NPN transistors 161 and 162 are controlled by a value of the constant current flowing through the NPN transistor 160.

In the above-mentioned AGC circuit shown in FIG. 7, when the control signal CL is set to the high level (CL=H), the NPN transistor 169 is turned on. Thus, an emitter voltage of the NPN transistor 162 is equal to the source voltage VCC. Thus, the NPN transistor 162 is set to a cut-off state and no current flows through the NPN transistor 162.

Accordingly, the current flowing through the PNP transistor 157 is equal to the current flowing through the NPN transistor 161.

On the other hand, when the control signal is set to a low level (CL=L), the NPN transistor 169 is turned off. Thus, the NPN transistor 162 is turned on and the constant current flowing through the PNP transistor 157 is equal to a sum of the currents flowing through the NPN transistors 161 and 162.

That is, when the control signal CL is set to the high level, the constant currents IbA, IbB, IbC and IbD are decreased to be less than those obtained when the control signal CL is set to the low level. This causes bandwidths of the input units 120A, 120B, 120C and 120D to be narrowed, but the accuracy of linearity of the AGC output is increased.

On the other hand, when the control signal is set to the low level, the constant currents IbA, IbB, IbC and IbD are increased to be greater than those obtained when the control signal CL is set to the high level. This causes the accuracy of linearity of the AGC output to be relatively low, but the bandwidths of the input units 120A, 120B, 120C and 120D are broadened.

In the above-mentioned AGC circuit according to the third embodiment of the present invention, the control signal CL is set to the high level when the disk apparatus is in an on-track state in which a signal rendering the frequency to be equal to zero is input and a broad bandwidth is not required but a high accuracy of linearity of the AGC output is required. Thus, the bandwidths of the input units 120A, 120B, 120C and 120D are narrowed, but the accuracy of linearity is increased.

On the other hand, when the envelope servo is performed during a track search in which a high accuracy of linearity is not required but a broad bandwidth is required, the control signal CL is set to the low level. Thus, the accuracy of linearity of the AGC outputs A and B is relatively low, but the bandwidths of the input units 120A, 120B, 120C and 120D are broadened.

Additionally, when a high-speed search is performed in which a bandwidth sufficient for tracing the servo signal frequency is required and a high accuracy of linearity is not required, the control signal CL is set to the high level. Thus, the frequency bands of the input units 120A, 120B, 120C and 120D are relatively narrowed, while the accuracy of linearity of the AGC outputs A and B is increased.

As mentioned above, in the third embodiment of the present invention, the bandwidth of the input units is narrowed but the accuracy of linearity of the AGC outputs is increased when a broad bandwidth is not required but a high accuracy of linearity is required. On the other hand, the bandwidth of the input units is broadened but the accuracy of linearity of the AGC outputs is decreased when a broad bandwidth is required but a high accuracy of the linearity is not required. Thus, the AGC circuit according to the present embodiment is convenient for use.

Figure 10:
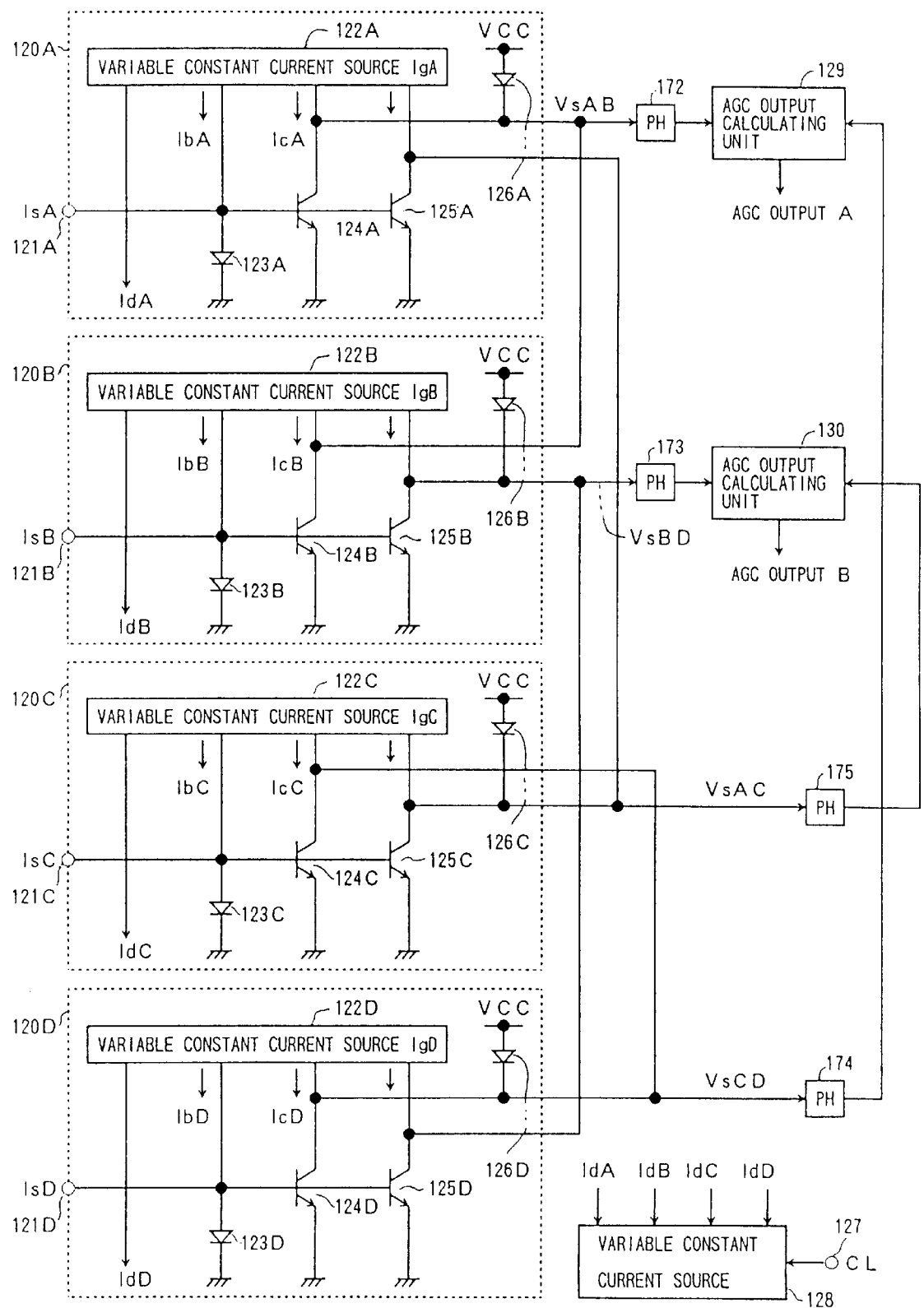
FIG. 10 is a circuit diagram of an AGC circuit according to a fourth embodiment of the present invention.

A description will now be given, with reference to FIG. 10, of a fourth embodiment of the present invention. FIG. 10 is a circuit diagram of an AGC circuit according to the fourth embodiment of the present invention. In FIG. 10, parts that are the same as the parts shown in FIG. 7 are given the same reference numerals, and descriptions thereof will be omitted.

The structure of the AGC circuit shown in FIG. 10 is the same as that of the third embodiment shown in FIG. 7 except for peak hold circuits (PH) 172, 173, 174 and 175 being added. The peak hold circuit 172 is provided between the input unit 120A and the AGC output calculating unit 129. The peak hold circuit 173 is provided between the input unit 120B and the AGC calculating unit 130. The peak hold circuit 174 is provided between the input unit 120D and the AGC output calculating unit 129. The peak hold circuit 175 is provided between the input unit 120C and the AGC output calculating unit 130. The circuit structure of each of the peak hold circuits 172 and 173 is the same as that of the peak hold circuit 86A shown in FIG. 6. The circuit structure of each of the peak hold circuits 174 and 175 is the same as that of the peak hold circuit 86B shown in FIG. 6.

In the above-mentioned fourth embodiment of the present invention, the control signal CL is set to the high level when the disk apparatus is in an on-track state in which a signal rendering the frequency to be equal to zero is input and a broad bandwidth is not required but high accuracy of linearity of the AGC output is required. Thus, the bandwidths of the input units 120A, 120B, 120C and 120D are narrowed, but the accuracy of linearity is increased.

In such a case, the time constants of the peak hold circuit 172 to 175 are decreased so that the output voltages VsAB, VsBD, VsAC and VsCD of the input units 120A, 120B, 120C and 120D are not influenced by the respective peak hold circuits 172 to 175.

On the other hand, when the envelope servo is performed during a track search in which a high accuracy of linearity is not required but a broad bandwidth is required, the control signal CL is set to the low level. Thus, the accuracy of linearity of the AGC outputs is relatively low, but the bandwidths of the input units 120A, 120B, 120C and 120D are relatively broadened.

In such a case, since the time constants of the peak hold circuits 172 to 175 are increased, a high-frequency noise, for example, due to a prepit (emboss data) can be eliminated, resulting in an accurate counting of track crossings during a track search.

Additionally, when a high-speed search is performed in which a bandwidth sufficient for tracing the servo signal frequency is required and a high accuracy of the linearity is not required, the control signal CL is set to the high level. Thus, the bandwidths of the input units 120A, 120B, 120C and 120D are relatively narrowed, but the accuracy of linearity of the AGC outputs is increased.

In such a case, the time constants of the peak hold circuits 172 to 175 are decreased so that the output voltages VsAB, VsBD, VsAC and VsCD of the input units 120A, 120B, 120C and 120D are not influenced by the respective peak hold circuits 172 to 175. Thus, an accurate counting of the track crossings is performed during a track search.

As mentioned above, in the fourth embodiment of the present invention, the bandwidth of the input units is narrowed but the accuracy of linearity of the AGC outputs is increased when a broad bandwidth is not required but a high accuracy of linearity is required. On the other hand, the bandwidth of the input units is broadened but the accuracy of linearity of the AGC outputs is decreased when a broad bandwidth is required but a high accuracy of linearity is not required. Thus, the AGC circuit according to the present embodiment is convenient for use, and performs an accurate counting of track crossings during a track search.

The present invention is not limited to the specifically disclosed embodiments, and variations and modifications may be made without departing from the scope of the present invention.

What is claimed is:

1. An automatic gain control circuit which is selectively set to a state where an output from said automatic gain control circuit has an accurate linearity or a state where said automatic control unit has a broad bandwidth with respect to inputs thereto, said automatic gain control circuit comprising:

a first input unit converting a first input current into a first voltage, a bandwidth of said first input unit being variable;

a second input unit, identical to said first input unit, converting a second input current into a second voltage, a bandwidth of said second input unit being variable;

a main variable constant current source generating a first constant current and a second constant current, said first constant current flowing from said first input unit to said main variable constant current source, said second constant current flowing from said second input unit to said main variable constant current source, said first and second constant currents being varied by a control signal supplied by an external signal source so that the bandwidths of said first and second input units are varied; and an automatic gain control output calculating unit calculating the output based on said first voltage and said second voltage.

2. The automatic gain control circuit as claimed in claim 1, wherein said first input unit includes a first variable constant current source which generates a first constant base current and a first constant conversion current in response to said first constant current flowing to said main variable constant current source, said first constant conversion current being converted into said first voltage based on said first input current and said first constant base current; and said second input unit includes a second variable constant current source which generates a second constant base current and a second constant conversion current in response to said second constant current flowing to said main variable constant current source, said second constant conversion current being converted into said second voltage based on said second input current and said second constant base current.

3. The automatic gain control circuit as claimed in claim 2, wherein said control signal is selectively set to one of a high level and a low level; and said first and second constant currents are set to a lower value when said control signal is set to the high level so that the output from said automatic gain control output calculating unit has an accurate linearity.

4. The automatic gain control circuit as claimed in claim 2, wherein said control signal is selectively set to one of a high level and a low level; and said first and second constant currents are set to a higher value when said control signal is set to the low level so that said first and second input units have a broad bandwidth.

5. The automatic gain control circuit as claimed in claim 2, wherein said first input unit includes a first transistor and a first load element, said first input current and said first constant base current being supplied to a base of said first transistor, said first constant conversion current being supplied to a collector of said first transistor, one terminal of said first load element being connected to a voltage source and an opposite terminal of said first load element being connected to said collector of said first transistor so that said first voltage is obtained at said opposite terminal of said first load element; and said second input unit includes a second transistor and a second load element, said second input current and said second constant base current being supplied to a base of said second transistor, said second constant conversion current being supplied to a collector of said second transistor, one terminal of said second load element being connected to the voltage source and an opposite terminal of said second load element being connected to said collector of said second transistor so that said second voltage is obtained at said opposite terminal of said second load element.

6. The automatic gain control circuit as claimed in claim 1, further comprising a first peak hold circuit, provided between said first input unit and said automatic gain control output calculating unit, having a first time constant with respect to a holding operation of a peak value of said first voltage, said first time constant being decreased when the bandwidth of said first input unit is narrowed, said first time constant being increased when the bandwidth of said first input unit is broadened; and a second peak hold circuit, identical to said first peak hold circuit and provided between said second input unit and said automatic gain control output calculating unit, having a second time constant with respect to a holding operation of a peak value of said second voltage, said second time constant being decreased when the bandwidth of said second input unit is narrowed, said second time constant being increased when the bandwidth of said second input unit is broadened.

7. The automatic gain control circuit as claimed in claim 6, wherein said first and second time constants are controlled based on said control signal.

8. An automatic gain control circuit which is selectively set to a state where an output from said automatic gain control circuit has an accurate linearity or a state where said automatic control unit has a broad bandwidth with respect to inputs thereto, said automatic gain control circuit comprising:

a first input unit converting a first input current into a first voltage, a bandwidth of said first input unit being variable;

a second input unit converting a second input current into a second voltage, a bandwidth of said second input unit being variable;

a third input unit converting a third input current into a third voltage, a bandwidth of said third input unit being variable;

a fourth input unit converting a fourth input current into a fourth voltage, a bandwidth of said fourth input unit being variable;

a main variable constant current source generating first, second, third and fourth constant currents, said first constant current flowing from said first input unit to said main variable constant current source, said second constant current flowing from said second input unit to said main variable constant current source, said third constant current flowing from said third input unit to said main variable constant current source, said fourth constant current flowing from said fourth input unit to said variable constant current source, said first, second, third and fourth constant currents being varied by a control signal supplied by an external signal source so that the bandwidths of said first, second, third and fourth input units are varied:

a first automatic gain control output calculating unit calculating a first output based on said first voltage and said fourth voltage; and a second automatic gain control output calculating unit calculating a second output based on said second voltage and said third voltage.

9. The automatic gain control unit as claimed in claim 8, wherein
said first input unit includes a first variable constant current source which generates a first constant base current, a first constant conversion current and a first additional constant conversion current in response to said first constant current flowing to said main variable constant current source;
said second input unit includes a second variable constant current source which generates a second constant base current, a second constant conversion current and a second additional constant conversion current in response to said second constant current flowing to said main variable constant current source;
said third input unit includes a third variable constant current source which generates a third constant base current, a third constant conversion current and a third additional constant conversion current in response to said third constant current flowing to said main variable constant current source; and
said fourth input unit includes a fourth variable constant current source which generates a fourth constant base current, a fourth constant conversion current and a fourth additional constant conversion current in response to said fourth constant current flowing to said main variable constant current source;
wherein
said first and second constant conversion currents are converted into said first voltage;
said third and fourth constant conversion currents are converted into said fourth voltage;
said first and third additional constant conversion currents are converted into said third voltage; and
said second and fourth constant conversion currents are converted into said second voltage.

10. The automatic gain control circuit as claimed in claim 9, wherein said control signal is selectively set to one of a high level and a low level; and said first, second, third and fourth constant currents are set to a lower value when said control signal is set to the high level so that said first and second outputs from said first and second automatic gain control output calculating units have an accurate linearity.

11. The automatic gain control circuit as claimed in claim 9, wherein said control signal is selectively set to one of a high level and a low level; and said first, second, third and fourth constant currents are set to a higher value when said control signal is set to the low level so said first, second, third and fourth input units have broad bandwidths.

12. The automatic gain control circuit as claimed in claim 9, wherein
said first input unit includes a first transistor, a first additional transistor and a first load element, said first input current and said first constant base current being supplied to a base of each of said first transistor and said first additional transistor, said first constant conversion current being supplied to a collector of said first transistor, said first additional constant conversion current being supplied to a collector of said first additional transistor, one terminal of said first load element being connected to a voltage source and an opposite terminal of said first load element being connected to said collector of said first transistor so that said first voltage is obtained at said opposite terminal of said first load element;
said second input unit includes a second transistor, a second additional transistor and a second load element, said second input current and said second constant base current being supplied to a base of each of said second transistor and said second additional transistor, said second constant conversion current being supplied to a collector of said second transistor, said second additional constant conversion current being supplied to a collector of said second additional transistor, one terminal of said second load element being connected to the voltage source and an opposite terminal of said second load element being connected to said collector of said second additional transistor so that said second voltage is obtained at said opposite terminal of said second load element;
said third input unit includes a third transistor, a third additional transistor and a third load element, said third input current and said third constant base current being supplied to a base of each of said third transistor and said third additional transistor, said third constant conversion current being supplied to a collector of said third transistor, said third additional constant conversion current being supplied to a collector of said third additional transistor, one terminal of said third load element being connected to the voltage source and an opposite terminal of said third load element being connected to said collector of said third additional transistor so that said third voltage is obtained at said opposite terminal of said third load element; and
said fourth input unit includes a fourth transistor, a fourth additional transistor and a fourth load element, said fourth input current and said fourth constant base current being supplied to a base of each of said fourth transistor and said fourth additional transistor, said fourth constant conversion current being supplied to a collector of said fourth transistor, said fourth additional constant conversion current being supplied to a collector of said fourth additional transistor, one terminal of said fourth load element being connected to the voltage source and an opposite terminal of said fourth load element being connected to said collector of said fourth transistor so that said fourth voltage is obtained at said opposite terminal of said fourth load element.

13. The automatic gain control circuit as claimed in claim 8, further comprising
a first peak hold circuit, provided between said first input unit and said first automatic gain control output calculating unit, having a first time constant with respect to a holding operation of a peak value of said first voltage, said first time constant being decreased when the bandwidth of said first input unit is narrowed, said first time constant being increased when the bandwidth of said first input unit is broadened;
a second peak hold circuit, identical to said first peak hold circuit and provided between said second input unit and said second automatic gain control output calculating unit, having a second time constant with respect to a holding operation of a peak value of said second voltage, said second time constant being decreased when the bandwidth of said second input unit is narrowed, said second time being constant being increased when the bandwidth of said second input unit is broadened;
a third peak hold circuit, identical to said first peak hold circuit and provided between said third input unit and said second automatic gain control output calculating unit, having a third time constant with respect to a holding operation of a peak value of said third voltage, said third time constant being decreased when the bandwidth of said second input unit is narrowed, said third time constant being increased when the bandwidth of said third input unit is broadened; and a fourth peak hold circuit, identical to said first peak hold circuit and provided between said fourth input unit and said first automatic gain control output calculating unit, having a fourth time constant with respect to a holding operation of a peak value of said fourth voltage, said fourth time constant being decreased when the bandwidth of said fourth input unit is narrowed, said fourth time constant being increased when the bandwidth said fourth input unit is broadened.

14. The automatic gain control circuit as claimed in claim 13, wherein said first, second, third and fourth time constants are controlled based on said control signal.

* * * * *